(12) United States Patent
Jayaram et al.

(10) Patent No.: US 7,573,158 B2
(45) Date of Patent: Aug. 11, 2009

(54) PORTABLE ELECTRICAL APPLIANCE WITH OBJECT SENSING ASSEMBLY

(75) Inventors: Jaideep Jayaram, Milford, MA (US); Charles Thrasher, Millville, MA (US); Danny Xu, Quincy, MA (US); Robert Sherwood, El Paso, TX (US); Carlos Alberto Natividad, El Paso, TX (US)

(73) Assignee: Sunbeam Products, Inc., Boca Raton, FL (US)

( * ) Notice: Subject to any disclaimer, the term of this patent is extended or adjusted under 35 U.S.C. 154(b) by 219 days.

(21) Appl. No.: 11/509,380

(22) Filed: Aug. 24, 2006

(65) Prior Publication Data

US 2007/0046107 A1 Mar. 1, 2007

Related U.S. Application Data

(60) Provisional application No. 60/712,238, filed on Aug. 29, 2005.

(51) Int. Cl.
*H01H 47/24* (2006.01)
(52) U.S. Cl. ..................................... 307/117
(58) Field of Classification Search ................ 307/117
See application file for complete search history.

(56) References Cited

U.S. PATENT DOCUMENTS

| 4,906,818 | A | 3/1990 | Lumpp et al. | |
|---|---|---|---|---|
| 5,198,661 | A | * 3/1993 | Anderson et al. | ........... 250/221 |
| 5,805,767 | A | 9/1998 | Jouas et al. | |
| 6,091,888 | A | 7/2000 | Jane et al. | |
| 6,127,926 | A | 10/2000 | Dando | |
| 6,236,038 | B1 | * 5/2001 | Givet | .......................... 250/221 |
| 6,259,365 | B1 | * 7/2001 | Hagar et al. | ................. 340/557 |
| 6,444,986 | B1 | 9/2002 | Disser | |
| 2004/0251909 | A1 | 12/2004 | Taylor et al. | |
| 2007/0039556 | A1 | * 2/2007 | Cook et al. | ................. 119/166 |

* cited by examiner

*Primary Examiner*—Albert W Paladini
*Assistant Examiner*—Michael Rutland Wallis
(74) *Attorney, Agent, or Firm*—Hoffmann & Baron, LLP

(57) ABSTRACT

A portable electric appliance includes a housing, an electrically operable element positioned within the housing, a transmitter adapted to transmit a beam of radiation, and a receiver responsive to the beam of radiation. The transmitter is positioned external to the housing, and the receiver is positioned to receive the beam of radiation. The electrically operable element is de-energized in response to the beam of radiation being blocked or interrupted. A method adapted to disable a portable electric appliance includes transmitting a beam of radiation from a transmitter on the portable electric appliance, receiving the beam of radiation by a receiver on the portable electric appliance, and de-energizing an electrically operable element associated with the portable electric appliance in response to the beam of radiation being blocked or interrupted.

24 Claims, 9 Drawing Sheets

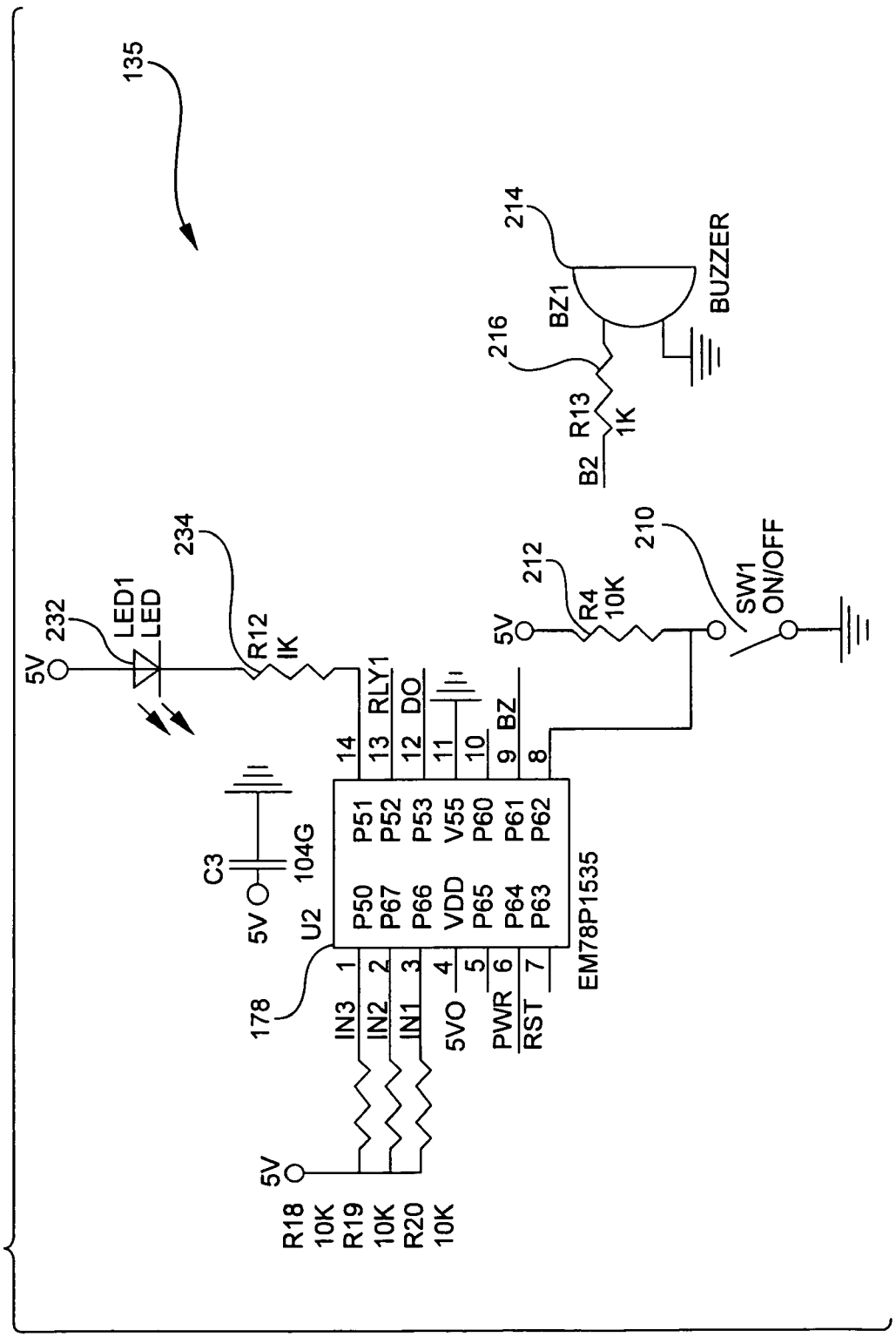

PORTABLE ELECTRICAL APPLIANCE WITH OBJECT SENSING ASSEMBLY

CROSS-REFERENCE TO RELATED APPLICATION

This application claims the benefit of U.S. Provisional Patent Application No. 60/712,238 filed Aug. 29, 2005, the disclosure of which is incorporated herein by reference.

BACKGROUND OF THE INVENTION

1. Field of the Invention

The field of the invention relates to portable electrical appliances such as heaters having sensors for detecting objects that may interfere with their operation.

2. Description of the Related Art

Portable appliances, such as heaters, have been provided with various sensors for determining whether an object is too close to them. Such sensors may be in the form of mechanical detectors as disclosed in U.S. Pat. No. 4,906,818. Electronic sensors have also been used to shut off a heater in the event an object is too close to the heater outlet. U.S. Pat. No. 5,805,767 discloses the use of motion sensors for this purpose. U.S. Pat. No. 6,091,888 discloses the use of infrared or ultrasonic proximity detectors for detecting a stationary or moving object within a predetermined distance of the heater inlet or outlet.

SUMMARY OF THE INVENTION

A portable electric appliance is provided that includes a housing having electrically operable elements and an outlet. A transmitter is mounted to the housing near the outlet and is capable of transmitting a beam of radiation. A receiver is mounted to the housing in opposing relation to the transmitter. The receiver is positioned to receive the beam of radiation from the transmitter. A control circuit is provided for deactuating the appliance in response to interruption of the beam between the transmitter and the receiver.

In one embodiment of the invention, the transmitter is an infrared transmitter and the receiver is an infrared receiver, both of which are positioned above the outlet as shown in FIG. 1. The appliance preferably includes an encoder for encoding the beam from the transmitter. A decoder is preferably provided for determining whether a correct signal has been received by the receiver from the transmitter. If a correct signal has not been received within a preselected period of time, the appliance and/or electrically operable elements are disabled and/or de-energized.

A transmitter, receiver, and control circuit as described above can be employed in association with various electrical appliances. For example, a portable humidifier can be equipped with a radiation transmitter and a detector near an inlet and/or outlet. A control circuit will shut down the humidifier if an object covers the inlet or outlet, thereby interrupting the beam from the transmitter to the detector. The appliance can alternatively be an electric heater.

A cover detector circuit is provided by the invention that checks for the presence of the infrared signal or other radiation signal sent by the transmitter. If a fault is detected, a control circuit, such as a microprocessor, microcontroller, or application specific integrated circuit (ASIC), stops the operation of the appliance. In the case of automatic heaters, the ASIC disables triac pulses. In the case of manual heaters, the 110 VAC supply is interrupted. The ASIC further may cause an LED or other indicator to be actuated when the path between the transmitter and detector is blocked. In a preferred embodiment, the ASIC must not receive a correct signal for a selected period of time (e.g. approximately 2.8 seconds) before it will disable the appliance. Short interruptions are ignored. Once a fault is detected and the appliance is disabled, the transmit signal needs to be detected correctly for a predetermined period before the ASIC will reset itself, turn off the LED and re-enable the appliance.

A portable electric appliance is provided in accordance with a preferred embodiment of the invention, which includes a housing, an electrically operable element positioned within the housing, a transmitter adapted to transmit a beam of radiation, and a receiver responsive to the beam of radiation. The transmitter is positioned external to the housing, and the receiver is positioned to receive the beam of radiation. The electrically operable element is de-energized in response to the beam of radiation being blocked or interrupted.

The transmitter may include an infrared or laser transmitter, and the receiver may include an infrared or laser receiver. The portable electrical appliance may include a heater, and the electrically operable element may include a heating element. The beam of radiation may be transmitted as pulses, and the electrically operable element may be de-energized in response to the beam of radiation being at least one of blocked or interrupted for a predetermined period of time.

The beam of radiation may be transmitted having a first value of an electrical characteristic, the beam of radiation may be received having a second value of the electrical characteristic, and the electrically operable element may be de-energized in response to the second value being unequal to the first value for a predetermined period of time. The electrical characteristic may include at least one of duty cycle, on-time, off-time, intensity, amplitude, and frequency.

The electrically operable element may be energized in response to the beam of radiation being unblocked or uninterrupted for a predetermined period of time. The beam of radiation may be transmitted having a first value of an electrical characteristic, the beam of radiation may be received having a second value of the electrical characteristic, and the electrically operable element may be energized in response to the second value being equal to the first value for a predetermined period of time.

A method adapted to disable a portable electric appliance is provided in accordance with a preferred embodiment of the invention, which includes transmitting a beam of radiation from a transmitter on the portable electric appliance, receiving the beam of radiation by a receiver on the portable electric appliance, and de-energizing an electrically operable element associated with the portable electric appliance in response to the beam of radiation being blocked or interrupted.

These and other objects, features, and advantages of this invention will become apparent from the following detailed description of illustrative embodiments thereof, which is to be read in connection with the accompanying drawing.

DETAILED DESCRIPTION OF THE PREFERRED EMBODIMENTS

Figure 1:
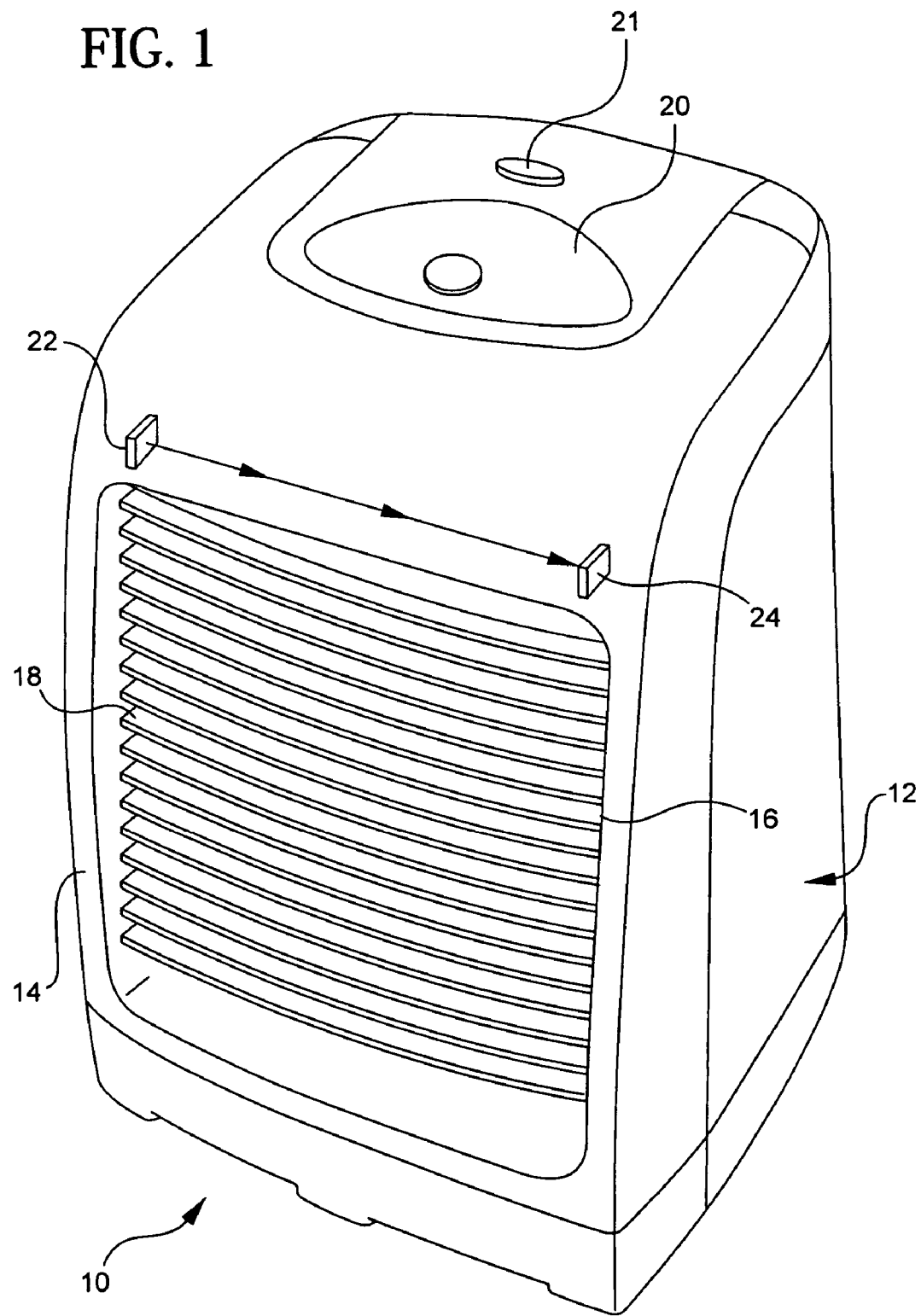
FIG. 1 is a top perspective view of a heater including an object sensing assembly in accordance with the invention.

A portable appliance in the form of a heater 10 is provided with an object sensing assembly that causes power to be interrupted or shut off if an object near the heater outlet is sensed. Referring to FIG. 1, the heater 10 includes a housing 12 having a front wall 14 that includes an outlet 16. A grill 18 having vanes is provided in the outlet 16. The vanes can be fixed or movable. Other types of heater grills are well known. Some, for example, include metal panels having rows of circular openings to allow the passage of heated air.

The top wall of the heater includes a control panel 20. The control panel may include a power button 21 for turning the heater on and off, a timer button (not shown) for setting the time of operation, and controls for adjusting a thermostat and/or controlling the amount of heat to be generated. These and other controls are known to the art.

The heater 10 shown in FIG. 1 includes one or more heating elements (not shown) that can be selectively operated. A fan (not shown) is present within the housing for moving air over the heating elements and through the outlet 16. Air can be drawn into the housing through one or more air inlets (not shown) in the rear wall of the housing or other suitable location. The heating elements can be resistance heating elements. Other types of portable heaters are known to the art, including radiant heaters that do not require the use of a fan. Such heaters may lack a grill.

The heater 10 includes an object sensing assembly that includes at least one radiation transmitter assembly 22 and at least one radiation receiver assembly 24 for receiving signals from the transmitter. As shown on FIG. 1, both the transmitter and receiver are mounted above the outlet 16. If the radiation path between the transmitter and receiver is interrupted, the heater is shut off. As discussed below, the radiation path must preferably be interrupted for a preselected time duration before the heater shuts off. While the heater could be shut off following a momentary interruption, such an arrangement is not preferred.

The locations of the transmitter 22 and receiver 24 assemblies are shown as being above the outlet. Obstructions, such as drapes or clothing items that may extend over the heater, will be readily detected. The transmitter and receiver assemblies preferably extend only a short distance from the front wall and are unobtrusive. Each is positioned near a side wall of the heater. The distance between the transmitter and receiver assemblies preferably at least generally corresponds to the maximum width of the outlet.

Figure 2:
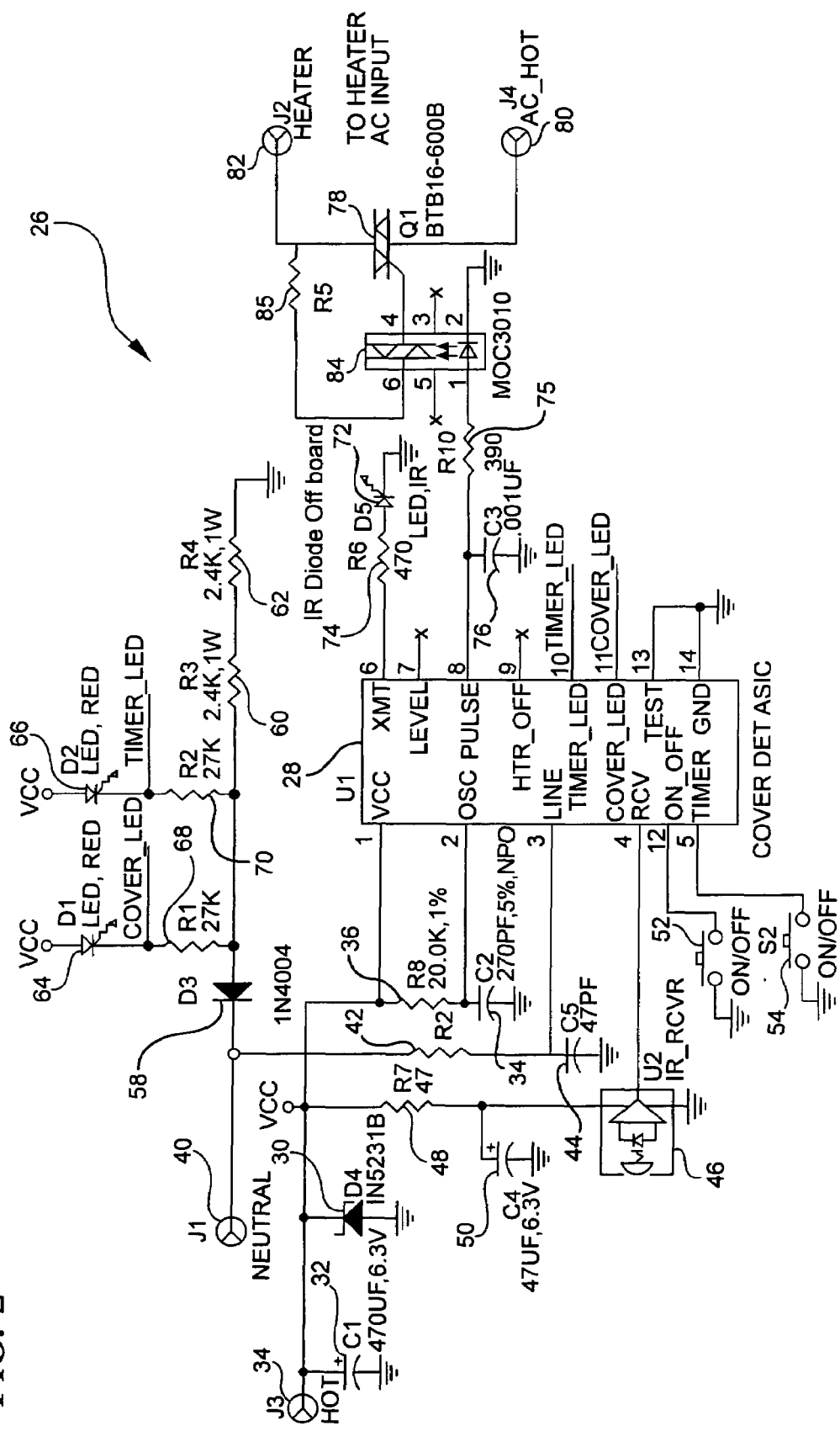
FIG. 2 is a schematic diagram of a first embodiment of a circuit to perform the object sensing function in accordance with the present invention.

FIG. 2 is a schematic diagram of a first embodiment of a circuit 26 to perform the object sensing function in accordance with the present invention. The object sensing circuit 26 preferably includes a cover detector application specific integrated circuit (ASIC) 28, which is connected at pin 1 to a 5 VDC power source provided by operation of Zener diode 30 and capacitor 32. Capacitor 32 and Zener diode 30 are connected in parallel across ground and a 110 VAC power supply, which is coupled to connector 34. Specifically, the anode of zener diode 30 is connected to ground and the cathode of zener diode 30 is coupled to connector 34. The 5 VDC power source is thus available at the cathode of zener diode 30.

The frequency of a clock signal internal to the cover detector ASIC 28 is controlled by resistor 36 and capacitor 38. Specifically, resistor 36 is preferably connected in series between pins 1 and 2 of a cover detector ASIC 28. Capacitor 38 is preferably connected in series between pin 2 of the cover detector ASIC 28 and ground.

The neutral or ground connection associated with the 110 VAC power source is preferably coupled to connector 40 and provided through resistor 42 to pin 3 of the cover detector ASIC 28. Capacitor 44 is connected in series between the cover detector ASIC 28 and ground, thus providing a direct connection to the 110 VAC line voltage and the cover detector ASIC 28 at pin 3 to enable it to operate whenever the heater is plugged in.

The output of an infrared (IR) receiver 46, incorporated as part of the receiver assembly 24 shown in FIG. 1, is preferably connected to pin 4 of the cover detector ASIC 28. The receiver 46 is connected to the 5 VDC power source (VCC) through a filter, which includes resistor 48 and capacitor 50. Specifically, capacitor 50 is connected in series between the IR receiver 46 and ground, and resistor 48 is connected in series between the IR receiver 46 and the 5 VDC power source. The IR receiver 46 is also connected to ground.

A switch 52 is preferably connected in series between pin 12 of the cover detector ASIC 28 and ground, and a switch 54 is preferably connected in series between pin 5 of the cover detector ASIC 28 and ground. Switch 52 is preferably used to manually turn the heater on and off, and switch 54 is preferably used to enable or disable a timer mode. The power button 21 on the heater controls the on/off status by means of the switch 52. The power is off by default (at power-on), and each push of the button will change the on/off status. While a power LED is not provided in the embodiment of FIG. 2, such an LED or other indicator could be used to indicate whether power is on or off.

The timer mode enables the heater to remain on for a predetermined period of time and to thereafter automatically turn off. In a preferred embodiment, the timer turns the heater off after about four hours. The power needs to be on before the timer can be used. The timer LED is turned on when the timer is activated. It provides steady illumination during the four-hour period, then flashes at a given rate (e.g. 400 ms on, 400 ms off, etc.) to indicate that the heater is off because the time has expired. If the timer button (not shown) is pushed while the timer is active, the timer function will be cancelled and the timer LED will turn off. If the heater is off because time has expired, only the power button (not shown) can be used to turn the heater back on.

The cathode of diode 58 is preferably connected to the neutral or return of the 110 VAC supply at connector 40 and half-wave rectifies the AC supply. Resistors 60 and 62 are preferably connected in series between the anode of diode 58 and ground to limit the current through diode 58. Current flows from the hot side of the AC line at connector 34 through Zener diode 58, resistor 62, resistor 60, and back to the neutral side of the AC line at connector 34 producing voltage across Zener diode 58. Since Zener diode 30 is connected from VCC to ground, a regulated voltage is created.

Light emitting diode 64 preferably provides an indication of when the heater is covered and diode 66 indicates when the heater is in the timer mode. The anode of diode 64 is preferably connected to the 5 VDC supply and its cathode is connected to pin 11 of the cover detector ASIC 28. Resistor 68 is connected in series between pin 11 of the cover detector 28 and the cathode of diode 64. Similarly, the anode of diode 66 is preferably connected to the 5 VDC supply and its cathode is connected to pin 10 of the cover detector ASIC 28.

Resistor 70 is preferably connected in series between pin 10 of the cover detector ASIC 28 and the cathode of diode 66. Thus, in response to pin 11 of the cover detector ASIC 28 being substantially grounded, diode 64 is illuminated, and in response to pin 11 being at or near 5 VDC, the diode 64 is turned off. Diode 66 operates in a similar manner in response to control by voltage levels output on pin 10 of the cover detector ASIC 28.

The cathode of infrared (IR) LED or transmitter 72 is preferably connected to ground and a resistor 74 is connected in series between pin 6 of the cover detector ASIC 28 and the anode of IR LED 72. The IR LED 72 is incorporated in the transmitter assembly 22 shown in FIG. 1 and provides the infrared signal to be received by the IR receiver 46, as described above.

Pin 8 of the cover detector ASIC 28 is preferably connected through resistor 75 to pin 1 of an optoisolated triac driver MOC3010, which is commercially available from Fairchild Semiconductor Corporation (www.fairchildsemi.com). Further details concerning the triac driver MOC3010 84 are provided in the "Random-Phase Optoisolators Triac Driver Datasheet", pp. 1-10 (2005), which is incorporated herein by reference. Capacitor 76 is connected in series between pin 8 of the cover detector ASIC 28 and ground, and operates to filter spikes that may occur on the AC supply to the heater.

A triac 78 selectively switches the 110 VAC supply coupled to connector 80 to the heater, which is coupled to connector 82. Pin 4 of a triac driver MOC3010 84 is preferably connected to a gate of the triac 78 and operates to control switching of the 110 VAC supply to the heater. Resistor 85 is preferably connected in series between connector 82 and pin 6 of the triac driver MOC 3010 84 to limit the gate current provided to the triac 78.

Figure 3:
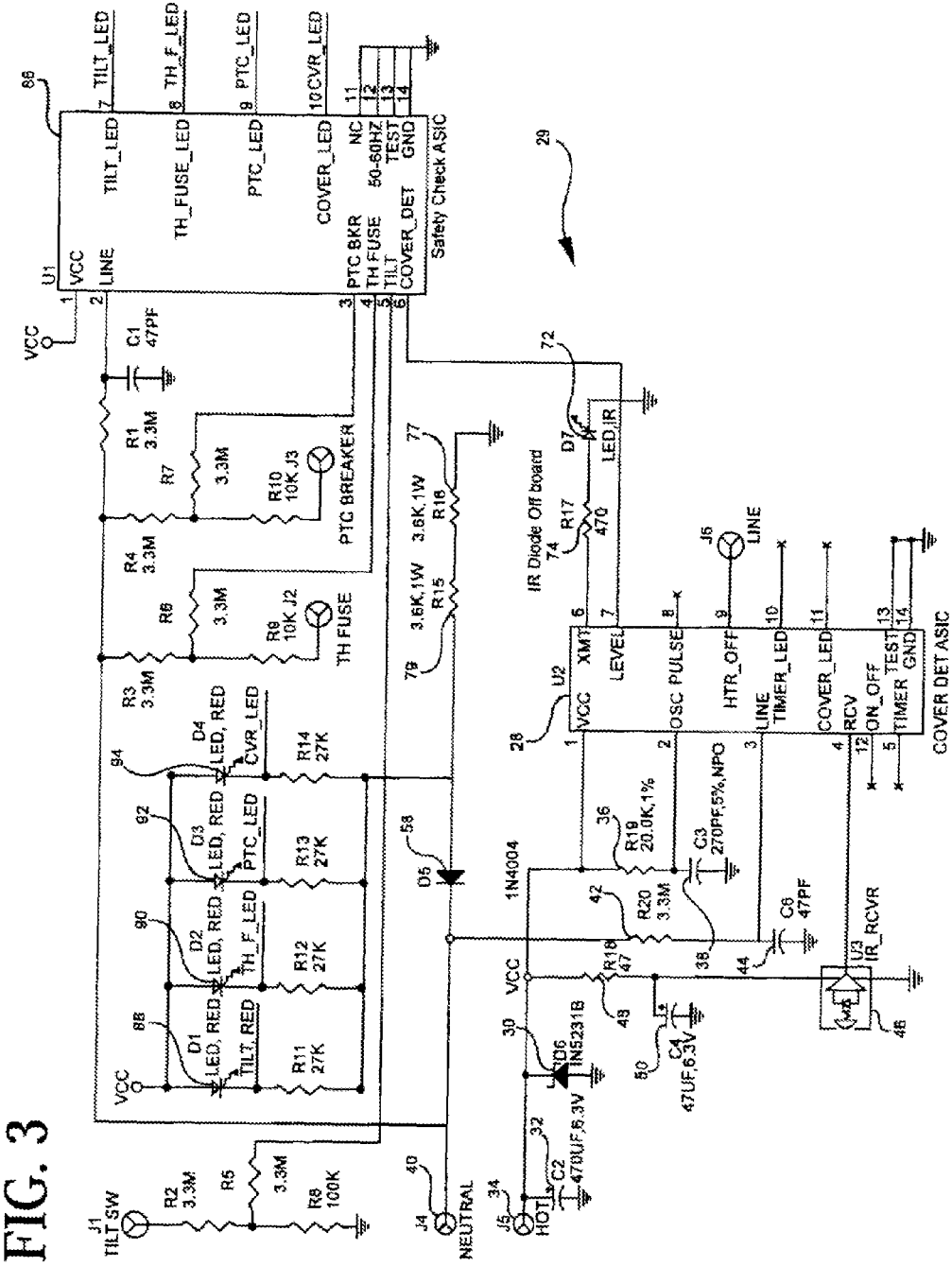
FIG. 3 is a schematic diagram of a second embodiment of a circuit to perform the object sensing function in accordance with the present invention.

FIG. 3 is a schematic diagram of a second embodiment of an object sensing circuit 29 to perform the object sensing function in accordance with the present invention. The second embodiment is essentially the same as the first embodiment described in connection with FIG. 2, except that the on/off switch and timer mode have not been implemented in the second embodiment, and thus switches 52, 54, diode 66, and the circuitry associated therewith have been omitted. In addition, indication of the cover detector function is provided through pin 7 of the cover detector ASIC 28, which is connected to pin 6 of a safety check ASIC 86 for this purpose.

The safety check ASIC 86 preferably indicates whether the object sensing assembly and/or other features of the heater are indeed operational when the heater is turned on. It may cause various indicators, such as LEDs associated with pins 7-10 thereof to illuminate if certain elements are inoperable.

In addition to the cover detector ASIC 28, other elements that can be tested for operability include a PTC breaker, a thermal fuse, and a tilt switch. As such an ASIC is not a necessary part of the invention described herein, further discussion of the ASIC is not provided. Additional LEDs 88-94 are provided for indicating when the tilt switch, thermal fuse, PTC breaker, and cover detector ASIC, respectively, have detected an abnormal condition.

A further distinction between the embodiments is that the cover detector ASIC 28 in FIG. 3 preferably controls whether the heater is turned off or not through action of the output at pin 9 of the cover detector ASIC 28 rather than pin 8 of the cover detector ASIC 28 shown in FIG. 1. Thus, the circuitry, which includes the triac 78, optoisolated triac driver MOC3010 84, resistor 75, and capacitor 76 shown in FIG. 2 have been omitted in FIG. 3. The cover detector ASIC 28 shown in FIG. 3 preferably controls whether or not the heater is turned off by means located in a position remote to the circuit shown in FIG. 3.

Figure 4:
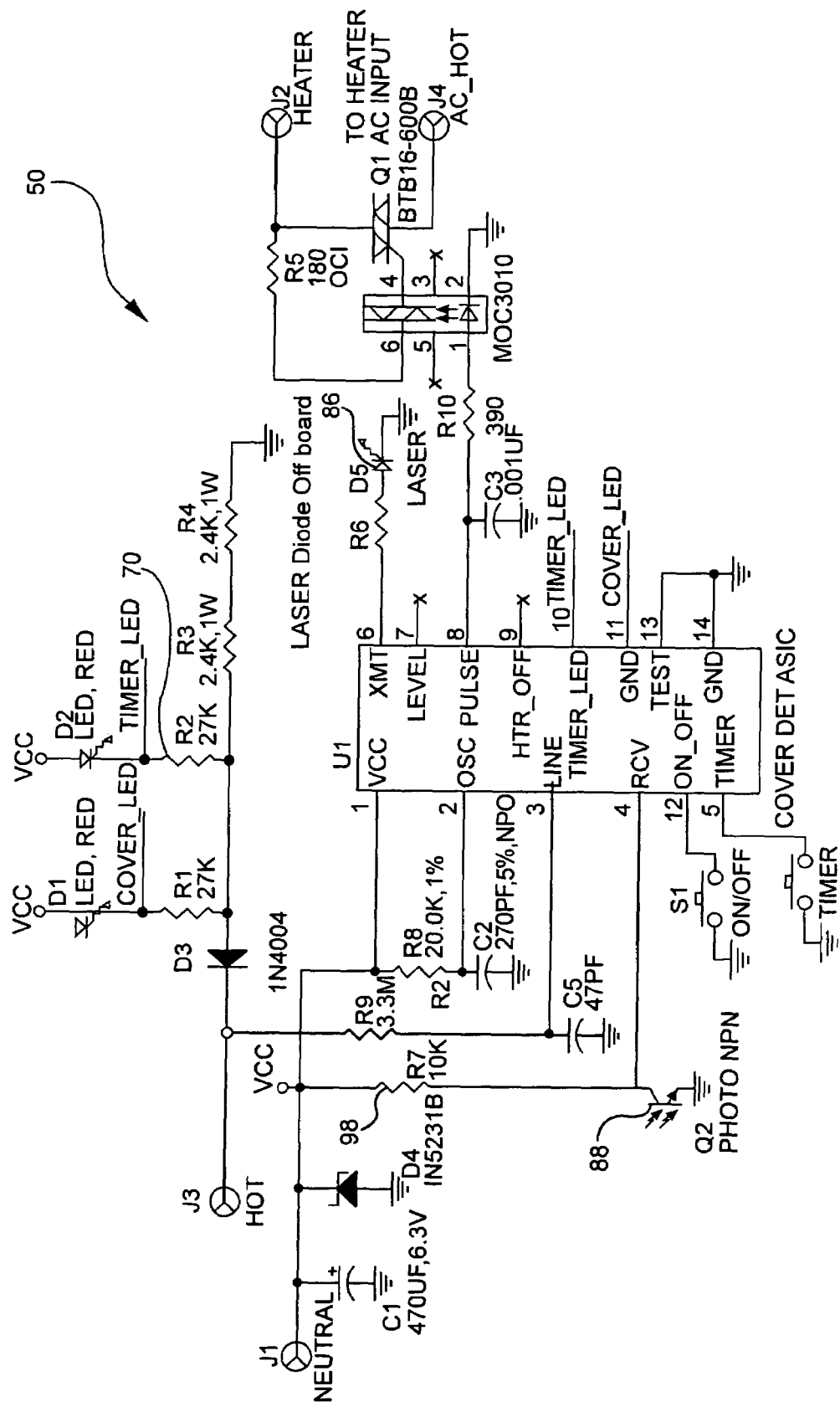
FIG. 4 is a schematic diagram of a third embodiment of a circuit to perform the object sensing function in accordance with the present invention.

FIG. 4 is a schematic diagram of a third embodiment of a circuit 50 to perform the object sensing function. The circuit 50 is substantially similar to that shown in FIG. 3, except that the IR diode 72 has been replaced with a laser diode or transmitter 86 and the IR receiver 46 has been replaced with a photo-sensitive transistor 88. In addition, the value of resistor 98 has been modified and capacitor 50 has been eliminated to accommodate different electrical characteristics of the photo-sensitive transistor 88.

Figure 5:
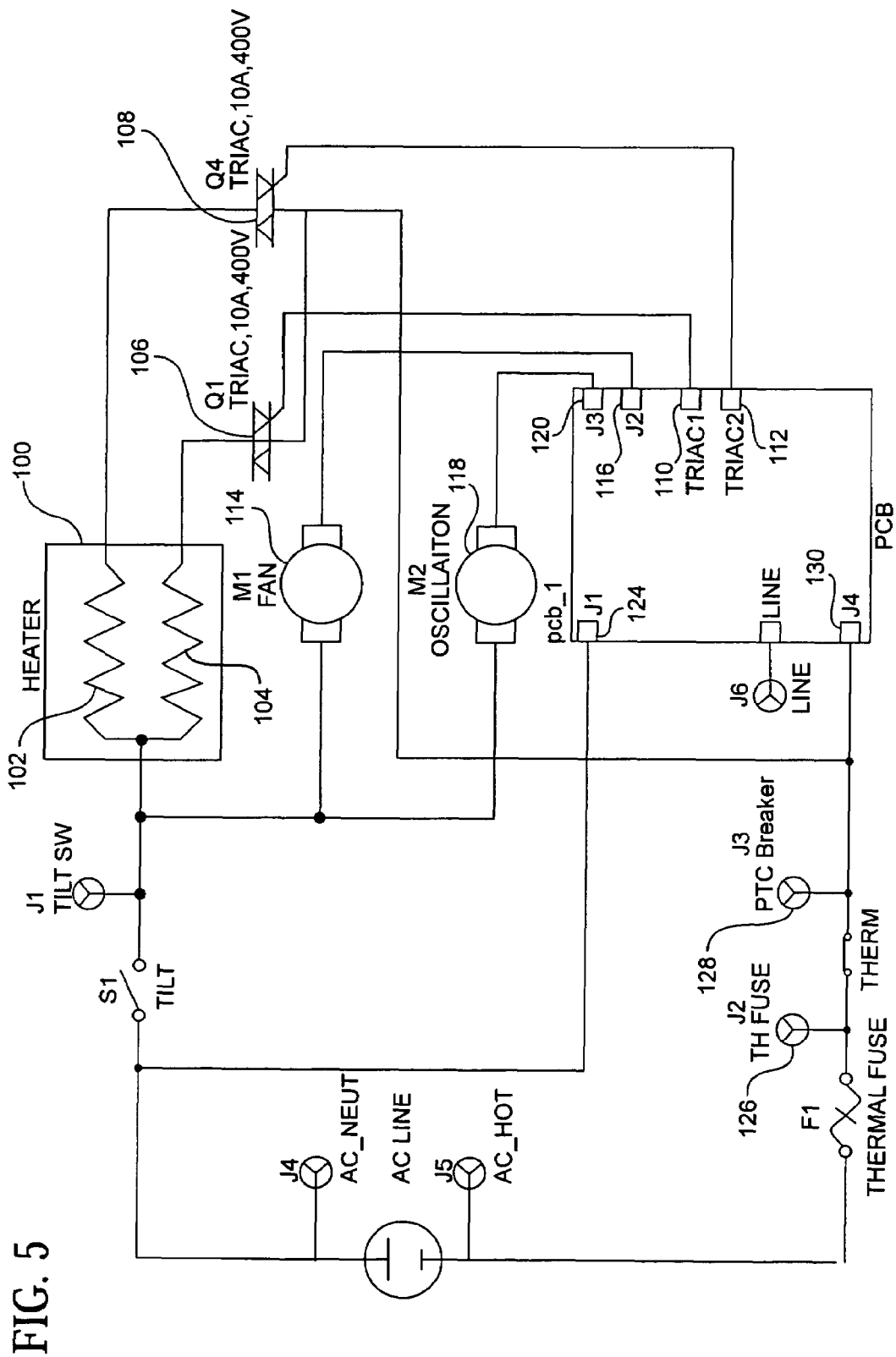
FIG. 5 is a schematic diagram of a heater in which the object sensing circuit of FIG. 2, 3, or 4 can be incorporated.

FIG. 5 is a schematic diagram of the heater, which may incorporate any of the object sensing circuits described above. The heater includes a heater assembly 100 including a pair of resistance heating elements 102, 104. The heating elements can be selectively operated to vary the heat output of the heater. Triacs 106 and 108 are connected in series between the respective heating elements 102, 104, and signals provided at terminals TRIAC1 110 and TRIAC2 112 of a printed circuit board (PCB) control the TRIACS 106, 108, respectively. A fan motor 114 is provided for causing a fan to blow air by the heating elements, thereby heating the air prior to its exiting the outlet 16 shown in FIG. 1.

The fan is selectively energized by a signal from the PCB at connector 116. An oscillating motor 118 is provided for oscillating the fan, thereby directing heated air in various directions as the fan oscillates back and forth. The oscillating motor is selectively energized by a signal from the PCB at connector 120. The heater can be operated with or without fan oscillation. The heater can also function as a fan when neither heating element is operated. The oscillating motor can alternatively cause the heater housing to oscillate back and forth about a vertical axis.

The heater includes various safety features in addition to the sensing assembly described above and shown in FIG. 2, 3, or 4. A tilt switch 132 shown in FIG. 3 is provided for cutting power to the heater assembly 100 and fans 114 and 118 if the heater is tilted beyond a predetermined amount. The tilt switch is connected to connector 124 of the printed circuit board. A thermal fuse 126 and a positive temperature coefficient breaker 128 are connected in series between the source of AC current and the PCB at connector 130. They are also connected to the triacs 106 and 108. Power to the heater assembly 100 is disconnected in the event of an overheating and/or over-current condition by operation if the fuse 126 and/or breaker 128.

Figure 6:
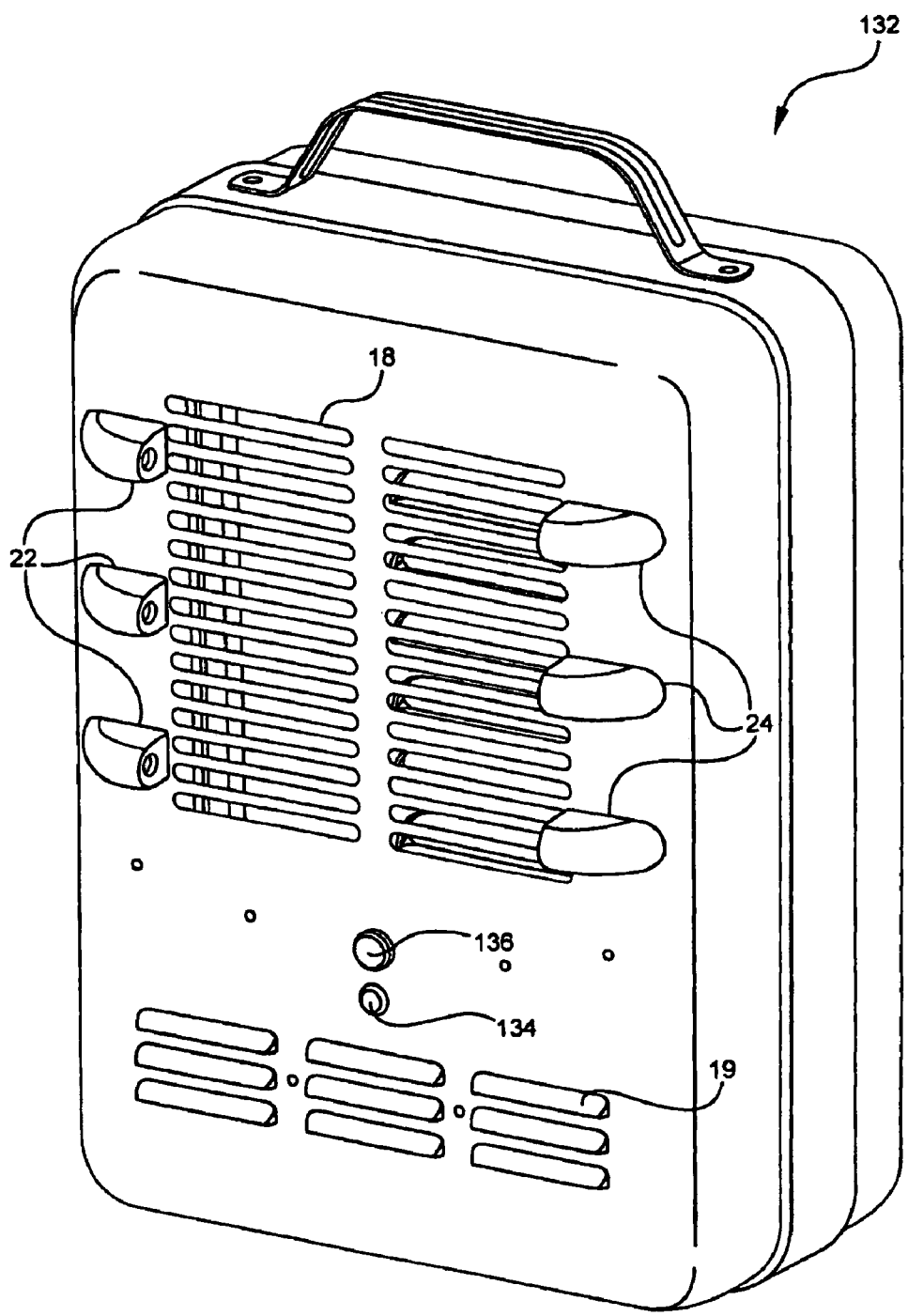
FIG. 6 is a top perspective view of a second embodiment of the object sensing assembly in accordance with the invention.

FIG. 6 shows a second embodiment 132 of the heater formed in accordance with the present invention, which is substantially similar to that shown in FIG. 1, except that there are preferably three sets of radiation transmitter and receiver assemblies 22, 24. The assemblies 22, 24 are preferably located along the left and right sides of the grill 18. In addition, air inlets 19, a power button 134, and a power indicator 136 are provided along the lower front side of the heater 132. The heater 10 shown in FIG. 1 includes one or more heating elements (not shown) that can be selectively operated. A fan (not shown) is present within the housing for moving air over the heating elements and through the outlet 16. Air can be drawn into the housing through one or more air inlets (not shown) in the rear wall of the housing or other suitable location. The heating elements can be resistance heating elements. Other types of portable heaters are known to the art, including radiant heaters that do not require the use of a fan. Such heaters may lack a grill.

As in the embodiment shown in FIG. 1, if any one of the radiation paths between the transmitter and receiver assemblies is interrupted, the heater is preferably shut off and/or the heating elements de-energized. The radiation path must preferably be interrupted for a preselected time duration before the heater shuts off. While the heater could be shut off following a momentary interruption, such an arrangement is not preferred.

Figure 7A:
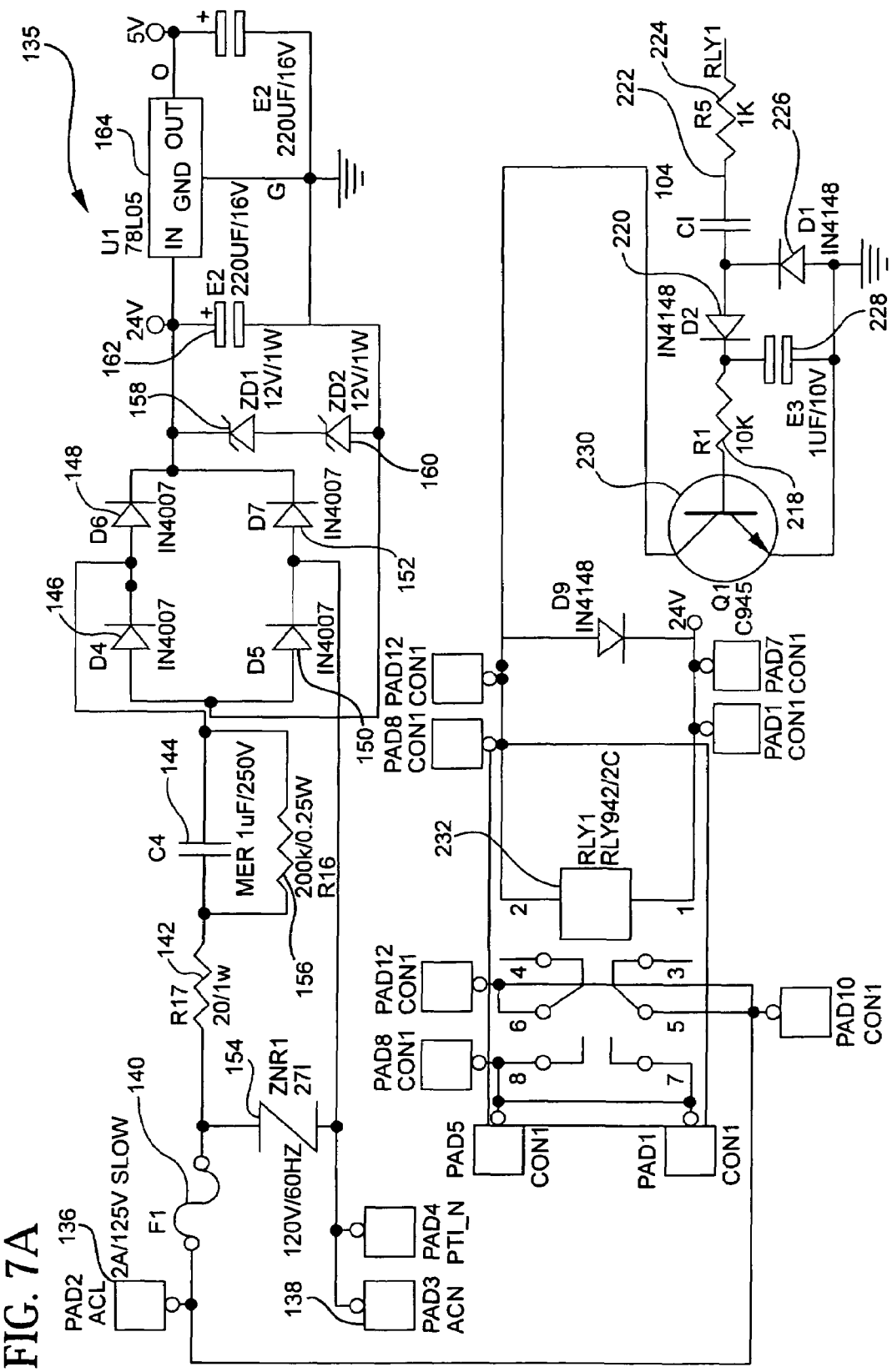
FIG. 7 is a schematic diagram of a fourth embodiment of a circuit to perform the object sensing function in accordance with the present invention.
Figure 7C:
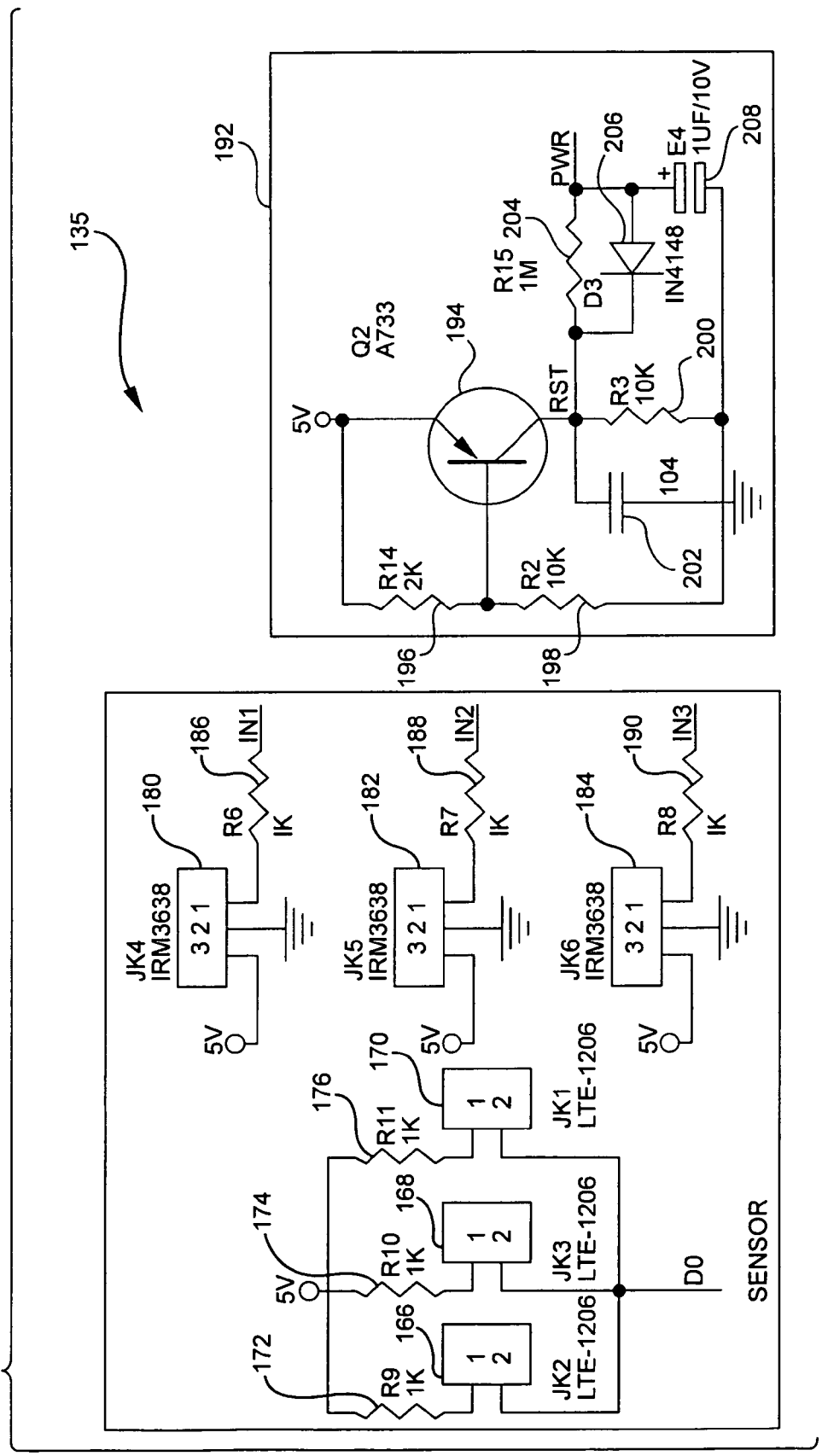

FIG. 7 is a schematic diagram of a fourth embodiment 135 of a circuit to perform the object sensing function. The circuit 135 includes a power control portion, which is connected to AC input power pads 136, 138. Pad 136 is connected in series with a fuse 140, a resistor 142, and a capacitor 144. The capacitor 144 is connected to an input of a bridge rectifier, which includes diodes 146, 148, 150, 152 which rectifies the input AC power supply to a DC power supply. A Zener diode 154 is connected from the fuse 140 to pad 138 and a resistor 156 is connected in parallel across the capacitor 144. The capacitor 144 and resistor 156 preferably operate to filter spikes and noise from the input power signal. The Zener diodes 158, 160 are preferably connected in series from an input of the bridge rectifier to pad 138 and provide a 24 VDC power source. A capacitor 162 is preferably connected in parallel with the Zener diodes 158, 162. A 5-volt regulator 164 is connected to the output of the bridge rectifier and supplies a 5 VDC power supply at its output.

The circuit 135 also includes a sensor assembly, which incorporates three infrared (IR) LEDs 166, 168, 170, each of which are connected through a resistor 172, 174, 176 to the 5 VDC power source, as well as being connected to pin 12 of a microcontroller 178. The sensor assembly also includes 3 infrared receivers 180, 184, each of which are connected to the 5-volt power supply and a resistor 186, 188, 190, respectively. Each of the resistors 186, 188, 190 are then connected to separate inputs pins 1-3 of a microcontroller 178.

The microcontroller 178 preferably pulses the IR LEDs 166, 168, 170 at pin 12 and obtains an indication of whether the beam of radiation emitted by the IR LEDs 166, 168, 170 has been blocked and/or interrupted through receipt of a signal representing the received infrared light on pins 1-3. The infrared LEDs 166, 168, 170 are preferably pulsed at a predetermined frequency (such as 38 KHZ) transmitted in a predetermined sequence (such as on for 2 seconds, off for 1 second, and on for 3 seconds), and/or transmitted with a predetermined electrical characteristic, such as but not limited to variations in duty cycle, on-time, off-time, intensity, amplitude, and frequency while remaining within the scope of the present invention including.

The microcontroller 178 preferably determines when the received infrared signal substantially matches that transmitted and, if not, raises an error condition that represents blockage of the beam of radiation, which signals the heating elements to be turned off by the microcontroller 178. Entry into the error condition may be delayed for a predetermined period of time such that blockage of the transmitted beam must be more than transitory before the heating elements are turned off. Similarly, if the microcontroller 178 determines that the received infrared signal substantially matches that transmitted, the error condition is either not entered or, if the error condition is already present, it may be exited such that the heating elements are turned on again following a predetermined period of time after blockage of the beam of light has been removed.

Circuit 135 also includes a reset and 5 VDC monitoring circuit 192, which detects the 5 VDC power supply and provides a reset signal to the microcontroller 178 in accordance with its electrical specifications. Circuit 192 includes a transistor 194 and a resistor 196 connected from the base to the emitter of the transistor 194. The circuit 192 also includes resistor 198 connected from the base of the transistor 194 to ground, a resistor 200 connected from the collector of the transistor 194 to ground, and a capacitor 202 connected from the collector of the transistor 194 to ground. A resistor 204 is connected in series between the collector of the transistor 194 and pin 6 of the microcontroller 178, a diode 206 is connected in parallel across the resistor 204, and a capacitor 208 is connected from pin 6 of the microcontroller 178 to ground.

The state of an on/off switch 210, which is connected to the 5 VDC power supply through a resistor 212 is monitored at pin 8 of the microcontroller. An audio indicator 214 or buzzer is connected to pin 9 of the microcontroller 178 through a resistor 216.

The microcontroller 178 is preferably able to control energization of the heating elements by action of pin 13, which is connected to the series combination of a resistor 218, diode 220, capacitor 222, and resistor 224. The diode 226 is connected across a point between the diode 220 and the capacitor 222 and ground. A capacitor 228 is connected between a point between the resistor 218 and the diode 220 and ground. The collector of transistor 230 is preferably connected to a relay 232 and the emitter of the transistor 230 is preferably connected to ground. Thus, the microcontroller 178 is able to control whether the transistor 230 is either conducting or not conducting, which selectively energizes the relay 232 that further selectively energizes the heating elements (not shown). Circuit 135 also includes a light emitting diode 232, which is connected to pin 14 of the microcontroller 178 through a resistor 234 and is preferably used to indicate whether the heater is powered or not.

It will be appreciated that more than one transmitter receiver pair may be incorporated on the heater. One such additional pair could extend from the front wall 14 near the bottom of the heater while another pair could extend from the rear wall near an air inlet. As discussed above, the present invention may be applicable to other portable consumer appliances where it may be desirable to turn the appliance off if an object is covering an inlet, an outlet, or other element thereof. Other modifications could be made without departing from the spirit of the invention.

Although the illustrative embodiments of the present invention have been described herein with reference to the accompanying drawings, it is to be understood that the invention is not limited to those precise embodiments, and that various other changes and modifications may be effected therein by one skilled in the art without departing from the scope or spirit of the invention.

What is claimed is:

1. A portable electric heater comprising:
    a housing including an outlet;
    an electrically operable heating element positioned within the housing, the heating element to provide heat to the outside of the housing through the outlet;
    a transmitter adapted to transmit a beam of radiation, the transmitter being positioned on the housing and proximate the outlet; and
    a receiver responsive to the beam of radiation, the receiver being positioned on the housing and proximate the outlet to receive the beam of radiation, the beam of radiation being proximate the outlet but not directed across or through the outlet, the electrically operable heating element being de-energized in response to the beam of radiation being at least one of blocked and interrupted.

2. The portable electric heater defined by claim 1, wherein the transmitter comprises an infrared transmitter and the receiver comprises an infrared receiver.

3. The portable electric heater defined by claim 1, wherein the transmitter comprises a laser transmitter and the receiver comprises a laser receiver.

4. The portable electric heater defined by claim 1, wherein the housing includes a first sidewall and a second sidewall opposite the first sidewall, the transmitter being positioned proximate the first sidewall, the receiver being positioned proximate the second sidewall.

5. The portable electric heater defined by claim 1, wherein the outlet includes a first vertical edge and a second vertical edge opposite the first vertical edge, the transmitter being positioned above the outlet and proximate the first vertical edge, the receiver being positioned above the outlet and proximate the second vertical edge.

6. The portable electric heater defined by claim 1, wherein the beam of radiation is transmitted as pulses.

7. The portable electric heater defined by claim 1, wherein the electrically operable element is de-energized in response to the beam of radiation being at least one of blocked for a predetermined period of time and interrupted for a predetermined period of time.

8. The portable electric heater defined by claim 1, wherein the beam of radiation is transmitted comprising a first value of an electrical characteristic, the beam of radiation being received comprising a second value of the electrical characteristic, the electrically operable element being de-energized in response to the second value being unequal to the first value for a predetermined period of time.

9. The portable electric heater defined by claim 8, wherein the electrical characteristic comprises at least one of duty cycle, on-time, off-time, intensity, amplitude, and frequency.

10. The portable electric heater defined by claim 1, wherein the electrically operable element is energized in response to the beam of radiation being at least one of unblocked for a predetermined period of time and uninterrupted for a predetermined period of time.

11. The portable electric heater defined by claim 1, wherein the beam of radiation is transmitted comprising a first value of an electrical characteristic, the beam of radiation being received comprising a second value of the electrical characteristic, the electrically operable element being energized in response to the second value being equal to the first value for a predetermined period of time.

12. The portable electric heater defined by claim 11, wherein the electrical characteristic comprises at least one of duty cycle, on-time, off-time, intensity, amplitude, and frequency.

13. A method adapted to disable a portable electric heater comprising:
    transmitting a beam of radiation from a transmitter disposed on a housing of the portable electric heater, the transmitter being disposed proximate an outlet of the housing that provides heat to the outside of the housing;
    receiving the beam of radiation by a receiver disposed on the housing of the portable electric heater, the receiver being disposed proximate the outlet of the housing, the beam of radiation being proximate the outlet but not directed across or through the outlet; and
    de-energizing an electrically operable heating element associated with the portable electric heater appliance in response to the beam of radiation being at least one of blocked and interrupted.

14. A method adapted to disable a portable electric heater defined by claim 13, wherein transmitting the beam of radiation comprises transmitting an infrared beam of radiation and receiving the beam of radiation comprises receiving the infrared beam of radiation.

15. A method adapted to disable a portable electric heater defined by claim 13, wherein transmitting the beam of radiation comprises transmitting a laser beam of radiation and receiving the beam of radiation comprises receiving the laser beam of radiation.

16. A method adapted to disable a portable electric heater defined by claim 13, wherein the housing includes a first sidewall and a second sidewall opposite the first sidewall, the transmitter being disposed proximate the first sidewall, the receiver being disposed proximate the second sidewall.

17. A method adapted to disable a portable electric heater defined by claim 13, wherein the outlet includes a first vertical edge and a second vertical edge opposite the first vertical edge, the transmitter being disposed above the outlet and proximate the first vertical edge, the receiver being disposed above the outlet and proximate the second vertical edge.

18. A method adapted to disable a portable electric heater defined by claim 13, wherein transmitting the beam of radiation comprises transmitting the beam of radiation as pulses.

19. A method adapted to disable a portable electric heater defined by claim 13, further comprising de-energizing the electrically operable element in response to the beam of radiation being at least one of blocked for a predetermined period of time and interrupted for a predetermined period of time.

20. A method adapted to disable a portable electric heater defined by claim 13, wherein transmitting the beam of radiation further comprises transmitting the beam of radiation comprising a first value of an electrical characteristic; wherein receiving the beam of radiation further comprises receiving the beam of radiation comprising a second value of the electrical characteristic, the method further comprising energizing the electrically operable element in response to the second value being equal to the first value for a predetermined period of time.

21. The method adapted to disable a portable electric heater defined by claim 20, wherein the electrical characteristic comprises at least one of duty cycle, on-time, off-time, intensity, amplitude, and frequency.

22. A method adapted to disable a portable electric heater defined by claim 13, further comprising energizing the electrically operable element in response to the beam of radiation being at least one of blocked for a predetermined period of time and uninterrupted for a predetermined period of time.

23. A method adapted to disable a portable electric heater defined by claim 13, wherein transmitting the beam of radiation further comprises transmitting the beam of radiation comprising a first value of an electrical characteristic; wherein receiving the beam of radiation further comprises receiving the beam of radiation comprising a second value of the electrical characteristic, the method further comprising energizing the electrically operable element in response to the second value being equal to the first value for a predetermined period of time.

24. The method adapted to disable a portable electric heater defined by claim 23, wherein the electrical characteristic comprises at least one of duty cycle, on-time, off-time, intensity, amplitude, and frequency.

* * * * *